(12) United States Patent
Johnson et al.

(10) Patent No.: US 6,298,568 B1
(45) Date of Patent: Oct. 9, 2001

(54) FEELER GAGE ALIGNMENT TOOL

(75) Inventors: Charles E. Johnson, Randolph, NJ (US); David John Pongracz, Bangor, PA (US); Nancy Susan Rush, Broadway, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/276,018

(22) Filed: Mar. 25, 1999

(51) Int. Cl.$^7$ ................................................. G01B 3/50
(52) U.S. Cl. ............................ 33/501.45; 33/645; 33/549
(58) Field of Search .......................... 33/501.45, 1 BB, 33/501.05, 501.06, 501.08, 533, 613, 645, 542, 545, 549

(56) References Cited

U.S. PATENT DOCUMENTS

| | | | |
|---|---|---|---|
| 2,582,679 | * | 1/1952 | Carroll ............................... 33/501.45 |
| 2,861,347 | * | 11/1958 | Tarnik ............................... 33/501.45 |
| 4,862,598 | * | 9/1989 | Barlow et al. ......................... 33/645 |
| 5,408,755 | * | 4/1995 | Russell ................................. 33/645 |

* cited by examiner

*Primary Examiner*—Christopher W. Fulton
(74) *Attorney, Agent, or Firm*—Duane Morris Heckscher LLP; Steven E. Koffs

(57) ABSTRACT

An apparatus holds a feeler gage. The apparatus includes a shaft having an end to which the feeler gage is attached. A fixture aligns the shaft with an opening into which the feeler gage is inserted. The opening may be a gap of a connector. A portion of the shaft is a measuring section having a plurality of markers. The markers are stripes, grooves, or lands on a portion of the shaft. The fixture comprises a channel, sleeve or bearing that guides the shaft onto the fixture. The fixture includes a ridge for insertion of the fixture onto a track. The fixture may have an alignment arm that engages a side surface of the connector. The fixture has a latch that attaches the fixture to the track. The latch of the fixture comprises two substantially parallel elongate members separated by a distance approximately equal to a width of the track. The feeler gage may be attached to the shaft by a clamp that allows any of a plurality of feeler gages to be detachably mounted, the plurality of feeler gages including gages having respectively different shapes and sizes. Alternatively, the assembly may include a plurality of shafts, each shaft attached to a respective feeler gage having a respectively different dimension, such that only one of the plurality of shafts is received by the track at any one time.

24 Claims, 2 Drawing Sheets

100

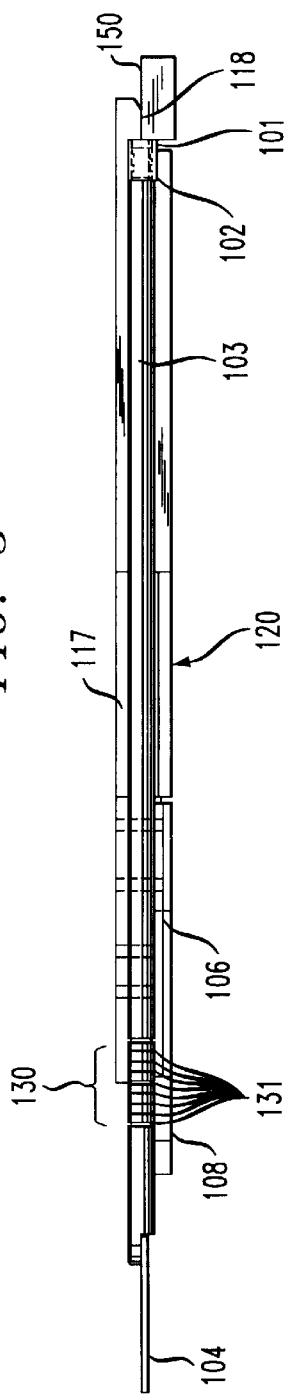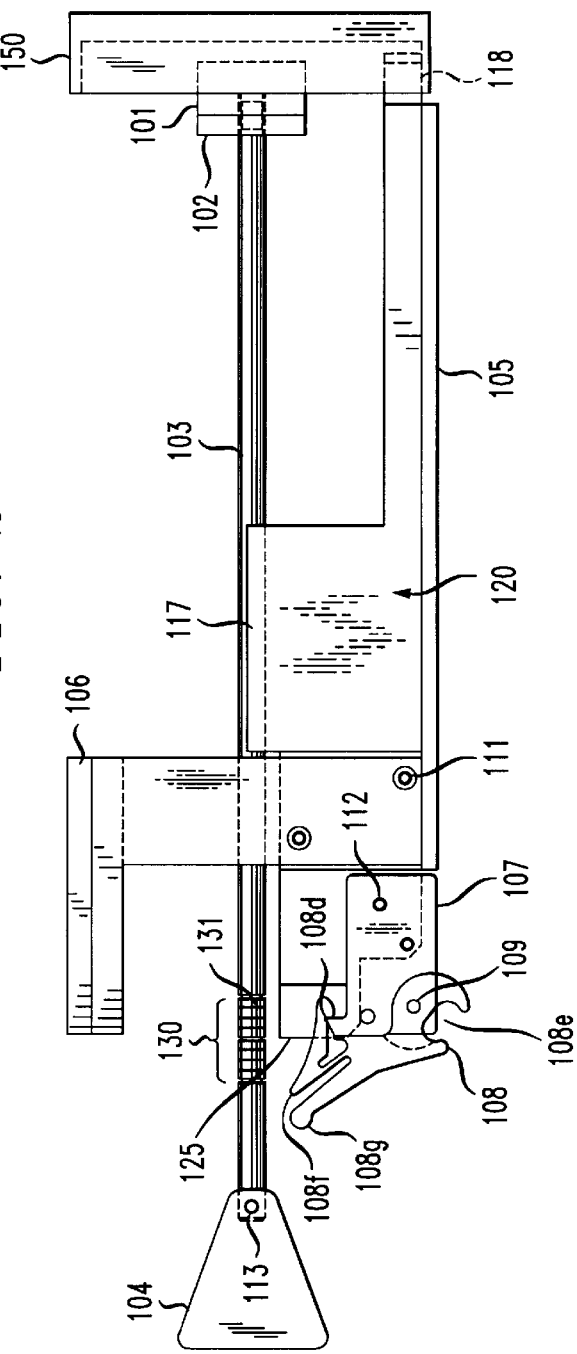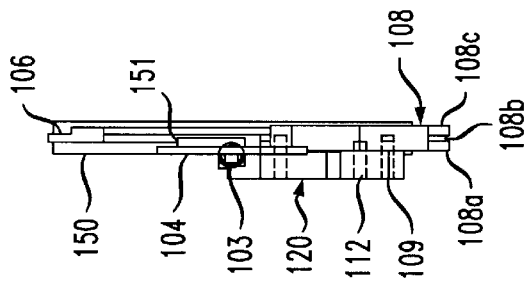

FEELER GAGE ALIGNMENT TOOL

FIELD OF THE INVENTION

The present invention relates to mechanical measurement apparatus.

DESCRIPTION OF THE RELATED ART

Feeler gages are well known. A feeler gage is a body having at least one predetermined dimension that is used as a standard. The feeler gage is inserted into an opening or gap that is to be measured. A determination is made as to whether the feeler gage fits into the opening or gap. If the gage is capable of insertion, then the dimension of the opening or gap is greater than that of the gage; if the gage is not capable of insertion, the dimension of the opening or gap is less than that of the gage. A first gage that is smaller than the opening and a second gage that is larger than the opening define a range of possible actual values for the dimension of the opening. By testing additional gages having intermediate sizes, it is possible to reduce the range of possible values of the dimension to be within any desired maximum tolerance.

In many applications, it is desirable to measure dimensions that are inaccessible. A method and device are desired for handling and insertion of feeler gages in locations that are difficult to reach manually.

SUMMARY OF THE INVENTION

The present invention is an apparatus for holding a feeler gage, including a shaft having an end to which the feeler gage is attached, and a fixture that aligns the shaft with an opening into which the feeler gage is inserted.

BRIEF DESCRIPTION OF THE DRAWINGS

FIG. 2 is a front elevation view of the apparatus shown in FIG. 1.

FIG. 3 is a top plan view of the apparatus shown in FIG. 1.

FIG. 4 is a left side elevation view of the apparatus shown in FIG. 1.

DETAILED DESCRIPTION

Figure 1:
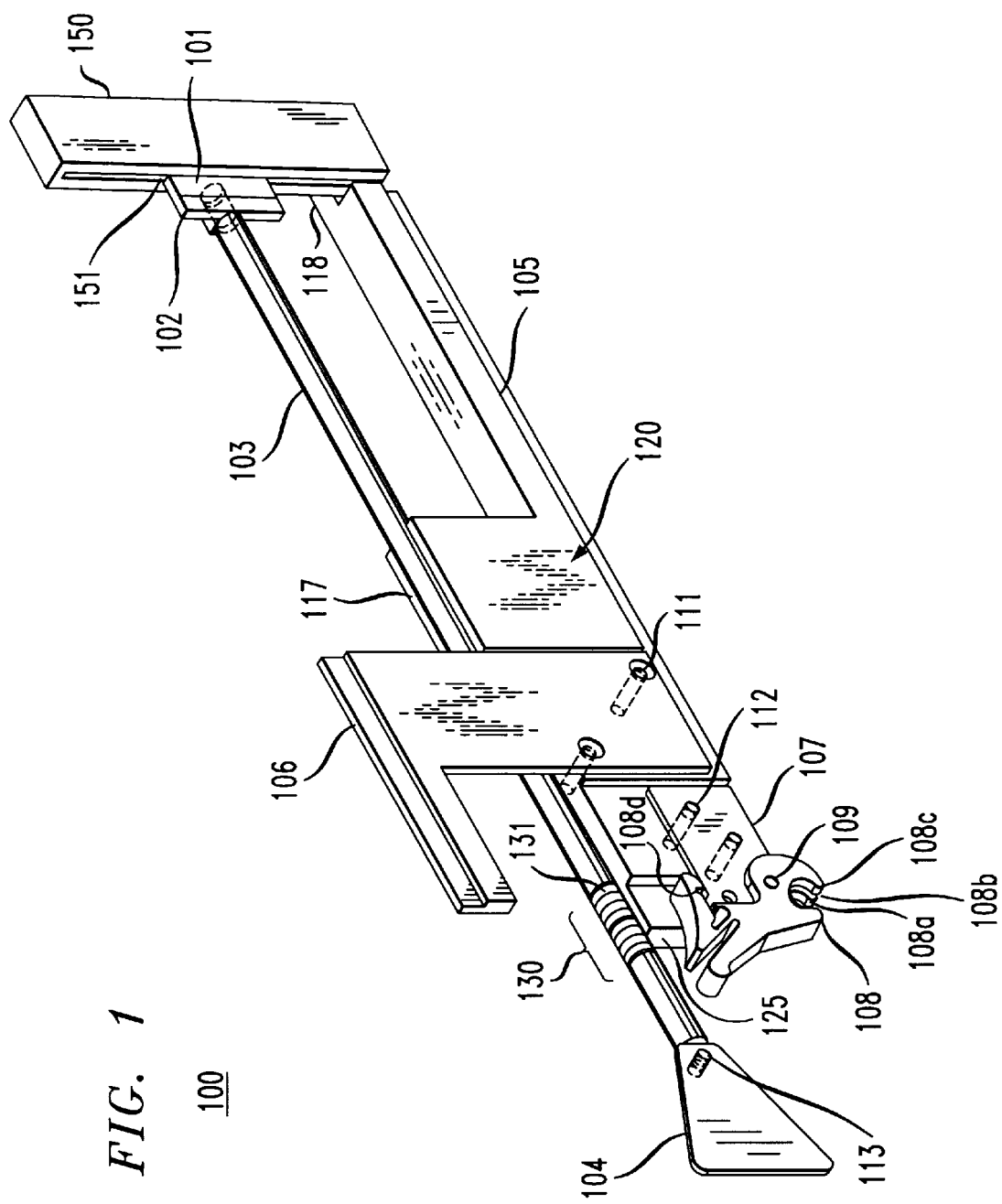
FIG. 1 is an isometric view of an exemplary feeler gage alignment apparatus according to the present invention.

For consistency and ease of understanding, the term "equipment" is used herein to refer to the surrounding environment into which the exemplary apparatus 100 according to the invention is inserted. The equipment may include a slot or track into which a printed circuit board is inserted to engage a card edge connector on a backplane. Other uses and environments for the apparatus 100 will become apparent to those of ordinary skill in the art.

FIGS. 1–4 show an exemplary feeler gage alignment apparatus 100 according to the invention. The apparatus 100 holds and aligns a feeler gage 101 with a connector 150. In the example, the apparatus 100 is used to measure one or more dimensions of a connector 150 in the equipment. The dimension may be, for example, the gap 151 between contacts or the depth of connector contacts (not shown). Connectors frequently include fragile pins or contacts (not shown) and may be located in positions which are not easily accessible by hand. The exemplary apparatus 100 may be used to measure dimensions of the gap 151 between the contacts of the connector 150, even though the connector may be positioned out of reach.

The apparatus allows measurements to be taken on operating equipment in areas difficult to reach.

The apparatus includes a fixture 120 for holding a feeler gage 101. The fixture 120 aligns the feeler gage 101 with an opening 151 into which the feeler gage 101 is inserted. The fixture 120 is sized and shaped to fit into the equipment (not shown) that contains the connector 150 during the measurement. For example, the exemplary fixture 120 is designed to fit into a card slot of the equipment in place of a printed circuit card (not shown). The fixture 120 includes track engaging portion 105 (which may be a ridge for fitting into a groove-type track or a channel for receiving a ridge type track) and a guide portion 106 that guides the fixture into the equipment. The guide 106 may be either a ridge or channel, depending on the shape of the equipment for which the apparatus 100 is to be used.

The apparatus 100 may be used in a field environment, in which the connector 150 is not easily accessed by hand. Moreover, using the apparatus 100, the technician can avoid inserting his or her hand into a narrow passage of the equipment containing electrical conductors. This may avoid damage to the equipment or injury to the technician.

Although the exemplary environment for the apparatus 100 is described with reference to a track (not shown) adapted to receive a side edge of a circuit card, one of ordinary skill in the art recognizes that printed circuit cards may have contacts on a side edge of the card, as well as the end edge. The ridge 105 and/or guide 106 may be slidably received by the contacts that receive the side of the card while the feeler gage 101 is used to measure the gap at the end of the card. Optionally, the fixture 120 may be configured so that its perimeter has the same shape as the card that connects to the connector 150.

The apparatus 100 includes a shaft 103 having an end to which the feeler gage 101 is attached. The feeler gage 101 may be attached to the shaft 103 by a clamp 102 that allows any of a plurality of feeler gages to be detachably mounted (Only one feeler gage 101 is shown). The plurality of feeler gages may include gages having respectively different shapes and thickness.

As shown in FIGS. 1 and 4, the exemplary opening is a gap 151 between contacts (not shown) in a slot of the connector 150. The exemplary assembly 100 is suitable for measuring the gap 151 between the contacts (not shown) of edge card connector 150, and detecting whether the contacts have either partially or completely collapsed, based on the measurement.

The feeler gage 101 may be flat. The feeler gage 101 may have a predetermined width and depth, which approximate the width and depth of a mating connector portion (not shown) that fits the connector receptacle 150. One of ordinary skill recognizes that measurement of both the height and width of an opening may be achieved by the same mechanism. To measure width of the gap, a plurality of feeler gages having respectively different widths are used. To measure height of the slot, a plurality of feeler gages having respectively different heights are used.

The fixture 120 further includes a latch mechanism 108 that attaches the fixture 120 to the track. The latch mechanism 108 includes a latch 108d. The latch 108 functions as an insertion portion, allowing insertion of the fixture 120 onto a track. The latch mechanism 108 of the fixture 120 includes two substantially parallel elongate members 108a and 108c (best seen in FIG. 4) separated by a groove 108b having a width approximately equal to a width of the track.

The latch mechanism 108 is pivotally mounted on a latch mount 107, and pivots about a pin 109. When the latch 108d is engaged, the elongate members 108a and 108c extend downward on opposite sides of the track. The elongate members 108a and 108c engage a shelf (not shown) which is below the fixture 120, and locks the fixture in place. The latch mechanism 108 may be released by squeezing latch handles 108f and 108g together and pivoting the latch 108 about pin 109.

The latch mechanism 108 provides a fixed reference for making depth measurements. Once the latch 108 is engaged, a prescribed depth and tolerance for the feeler gage 101 in the connector 150 can be determined.

In addition to the latch mechanism, the exemplary fixture 120 has an alignment arm 118 which engages a side surface of the connector 150 when the fixture is properly positioned. The alignment arm 118 provides an additional means for aligning the feeler gage 101 with the opening to be measured.

A portion 130 of the shaft 103 may be a measuring section having a plurality of markers 131. The markers 131 may be stripes, grooves, or lands on a portion of the shaft 103. By noting which marker 131 lines up most closely with a reference line, the depth of the opening 151 may be measured. The reference line may be, for example, the edge 125 of the fixture, or a groove or line (not shown) on the fixture. Optionally, for finer depth measurement, a vernier scale may be provided on a reference surface.

The fixture 120 has a bearing mechanism 117. The bearing mechanism 117 aligns the shaft 103 with the opening 151. The bearing mechanism 117 may be, for example, a rectangular or U-shaped open channel in which the shaft 103 is seated, as shown in FIGS. 1–3. Alternatively, the shaft 103 may be slidably received in a cylindrical sleeve (not shown). The bearing mechanism 117 may include a lubricant. The shaft 103 may have a handle 104 attached to an end opposite the feeler gage 101.

Alternatively, the shaft 103 may be threaded, and may be received in a threaded bore (not shown). If a threaded shaft 103 is used, then the shaft would include two sections and a bearing portion, so that the threaded handle end of the shaft 103 could rotate while the gage end of the shaft 103 is prevented from rotating. A threaded bore is more difficult to fabricate, and the threaded shaft would be more complex, but this variation may provide better control over the depth of the shaft 103.

The exemplary assembly 100 includes a single shaft 103 and a plurality of feeler gages 101, which are interchangeably attached to the shaft. Alternatively, the assembly could include a plurality of shafts 103, each shaft fixedly attached to a respective feeler gage 101 having a respectively different dimension; only one of the plurality of shafts would be received by the channel 117 at any one time. In this variation, the shaft-gage combination 101, 103 is exchanged, instead of just the gage 101. A detachable clamp 102 is not needed. The open channel 117 of the exemplary embodiment allows different shafts 103 to be interchanged easily.

Although the exemplary apparatus is adapted to measure a dimension of a connector for a circuit card, one of ordinary skill in the art can readily adapt a fixture according to the invention to measure one or dimensions of a variety of devices. An apparatus according to the invention is particularly advantageous when the dimension measured is a dimension of a device that is not easily accessible by hand.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. An apparatus for holding a feeler gage, comprising:
   a shaft having an end to which the feeler gage is attached; and,
   a fixture to which the shaft is mechanically mounted, the fixture aligning the shaft with an opening into which the feeler gage is inserted while moving the feeler gage relative to the fixture.

2. The apparatus of claim 1, wherein the feeler gage is attached to the shaft by a clamp, said clamp allowing any of a plurality of feeler gages to be detachably mounted, the plurality of feeler gages including gages having respectively different shapes and sizes.

3. The apparatus of claim 1, wherein a portion of the shaft is a measuring section having a plurality of markers.

4. The apparatus of claim 3, wherein the markers are stripes, grooves, or lands on a portion of the shaft.

5. The apparatus of claim 1, wherein the fixture further comprises a channel, sleeve, or bearing that holds the shaft and aligns the shaft with the fixture.

6. The apparatus of claim 5, wherein:
   said shaft is one of a plurality of interchangeable shafts that are included in the apparatus, each of the plurality of shafts having a respective feeler gage, each feeler gage having a respectively different dimension, and
   only one of the plurality of shafts is received by the channel, sleeve or bearing at any one time.

7. The apparatus of claim 1, wherein the fixture includes at least one ridge that allows insertion of the fixture onto a track.

8. The apparatus of claim 7, wherein the track is an edge card connector track and the ridge is shaped to fit the edge card connector track.

9. The apparatus of claim 7, wherein the fixture further comprises a latch that attaches the fixture to the track.

10. The apparatus of claim 9, wherein the latch of the fixture comprises two substantially parallel elongate members that are separated by a distance approximately equal to a width of the track.

11. The apparatus of claim 1, wherein the opening is an opening in a connector, and the fixture further comprises an alignment arm that engages a side surface of the connector.

12. A feeler gage assembly comprising:
   a feeler gage;
   a shaft having the feeler gage attached to one end thereof; and,
   a fixture to which the shaft is mechanically mounted, the fixture aligning said shaft with an opening into which the feeler gage is inserted while moving the feeler gage relative to the fixture.

13. The feeler gage assembly of claim 12, wherein the opening is a connector receptacle and the feeler gage is flat.

14. The feeler gage assembly of claim 13, wherein the feeler gage has a predetermined width and depth, which approximate the width and depth of a connector portion that fits the connector receptacle.

15. The feeler gage assembly of claim 13, wherein the feeler gage is substantially rectangular.

16. A method of measuring at least one dimension of an opening, comprising the steps of:
   aligning a fixture with the opening, the fixture having a shaft mechanically mounted thereon, the shaft having a feeler gage at an end thereof;

advancing the shaft relative to the fixture until the feeler gage reaches the opening; and, determining whether the feeler gage fits into the opening.

17. The method of claim 16, comprising the further steps of:

replacing the feeler gage with an additional feeler gage having a different width from the feeler gage; and repeating the advancing step, the determining step, and the replacing step, until a gage having approximately the same width as the opening is found.

18. The method of claim 17, further comprising the step of:

comparing markers on the shaft against a reference portion of the fixture, to determine the depth of the opening.

19. The method of claim 16, wherein the step of aligning the fixture with the opening further comprises:

inserting the fixture onto a track which is substantially aligned with the opening.

20. The method of claim 19, wherein the step of aligning the fixture with the opening further comprises:

latching the fixture to the track using a latch located on the fixture.

21. The method of claim 19, wherein the step of inserting the fixture onto the track further comprises:

aligning a latch of the fixture with the track, the latch comprising two substantially parallel elongate members, so that the track fits snugly between the two substantially parallel elongate members.

22. The method of claim 16, wherein the at least one dimension is the approximate width or depth of the opening.

23. The method of claim 16, wherein the opening is a receptacle of a connector on a backplane.

24. The method of claim 23, further comprising engaging a side surface of the connector with an alignment arm of the fixture.

* * * * *